United States Patent
Utsumi et al.

(10) Patent No.: US 12,154,834 B2
(45) Date of Patent: Nov. 26, 2024

(54) SILICON CARBIDE SEMICONDUCTOR DEVICE, SEMICONDUCTOR PACKAGE, AND METHOD OF INSPECTING SILICON CARBIDE SEMICONDUCTOR DEVICE

(71) Applicant: FUJI ELECTRIC CO., LTD., Kawasaki (JP)

(72) Inventors: Makoto Utsumi, Matsumoto (JP); Masaki Miyazato, Matsumoto (JP)

(73) Assignee: FUJI ELECTRIC CO., LTD., Kawasaki (JP)

(*) Notice: Subject to any disclaimer, the term of this patent is extended or adjusted under 35 U.S.C. 154(b) by 530 days.

(21) Appl. No.: 17/488,490

(22) Filed: Sep. 29, 2021

(65) Prior Publication Data

US 2022/0165629 A1     May 26, 2022

(30) Foreign Application Priority Data

Nov. 24, 2020   (JP) ................................. 2020-193979

(51) Int. Cl.
| | |
|---|---|
| H01L 21/66 | (2006.01) |
| G01R 31/26 | (2020.01) |
| H01L 29/06 | (2006.01) |
| H01L 29/10 | (2006.01) |
| H01L 29/16 | (2006.01) |
| H01L 29/78 | (2006.01) |

(52) U.S. Cl.
CPC .......... *H01L 22/32* (2013.01); *G01R 31/2644* (2013.01); *H01L 22/14* (2013.01); *H01L 29/063* (2013.01); *H01L 29/1095* (2013.01); *H01L 29/1608* (2013.01); *H01L 29/7813* (2013.01)

(58) Field of Classification Search
CPC ....... H01L 22/32; H01L 22/14; H01L 29/063; H01L 29/10965; H01L 29/1608; H01L 29/7813; G01R 31/2644
USPC .......................................................... 257/48
See application file for complete search history.

(56) References Cited

U.S. PATENT DOCUMENTS

| | | | | |
|---|---|---|---|---|
| 2012/0298994 A1* | 11/2012 | Sawada | .................... | H01L 24/05 257/E23.01 |
| 2013/0092978 A1* | 4/2013 | Sugawara | ........... | H01L 29/0834 257/E29.197 |
| 2016/0020310 A1* | 1/2016 | Shiga | .................. | H01L 23/4824 438/18 |
| 2018/0076290 A1* | 3/2018 | Takayanagi | ....... | H01L 29/66712 |

(Continued)

FOREIGN PATENT DOCUMENTS

| | | |
|---|---|---|
| JP | 2015-065250 A | 4/2015 |
| JP | 2018-120879 A | 8/2018 |
| JP | 2020155660 A | 9/2020 |

OTHER PUBLICATIONS

Japanese Office Action dated Jul. 2, 2024, in the counterpart Japanese Patent Application No. 2020-193979.

*Primary Examiner* — Igwe U Anya
(74) *Attorney, Agent, or Firm* — Rabin & Berdo, P.C.

(57) ABSTRACT

A portion of a source pad is exposed in an opening of a passivation film. In the exposed portion of the source pad, a wiring region in which a package wiring member is to be bonded and a probe region that is a region different from the wiring region are provided. The probe region has a probe mark of a probe for an energization inspection. An area of the probe mark that overlaps the wiring region is at most 30% of an entire area of the wiring region in a plan view of the silicon carbide semiconductor device.

12 Claims, 7 Drawing Sheets

(56) References Cited

U.S. PATENT DOCUMENTS

| 2018/0097103 A1* | 4/2018 | Sadamatsu | H01L 29/7805 |
| 2020/0287029 A1* | 9/2020 | Ishikawa | H01L 29/0696 |
| 2020/0303269 A1 | 9/2020 | Okumura | |

* cited by examiner

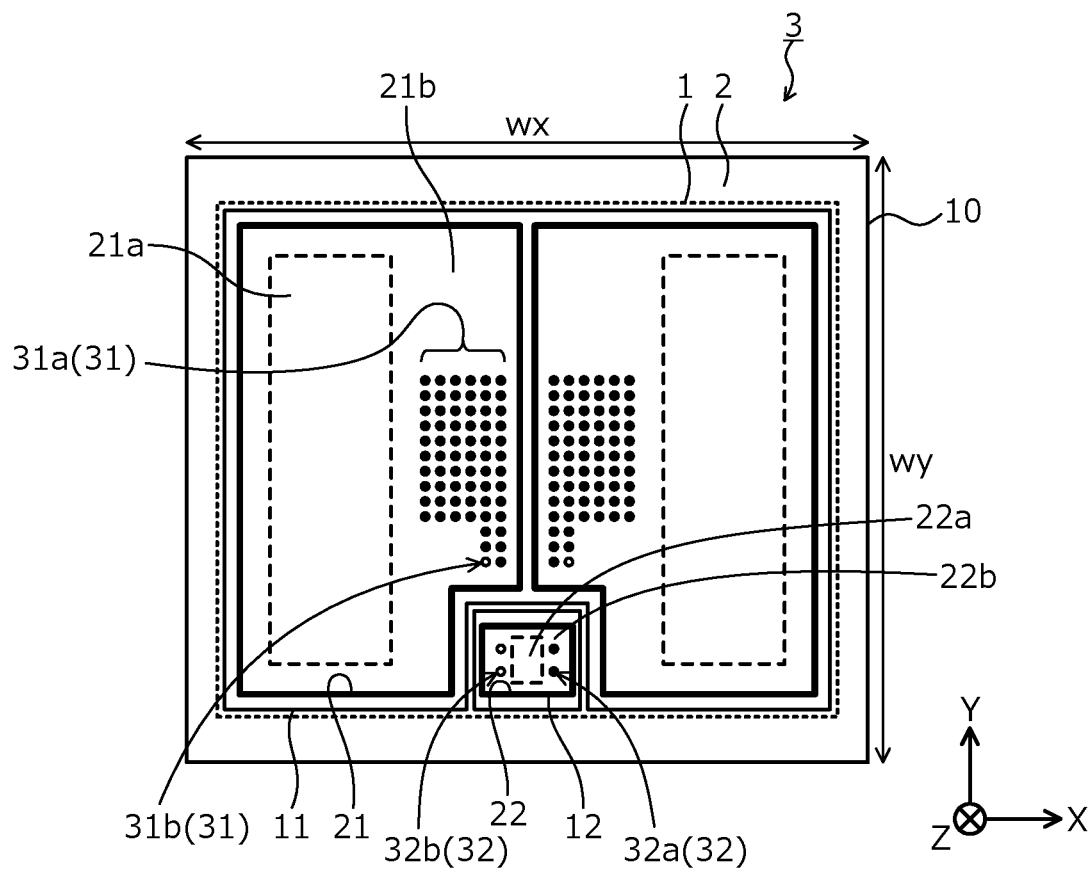

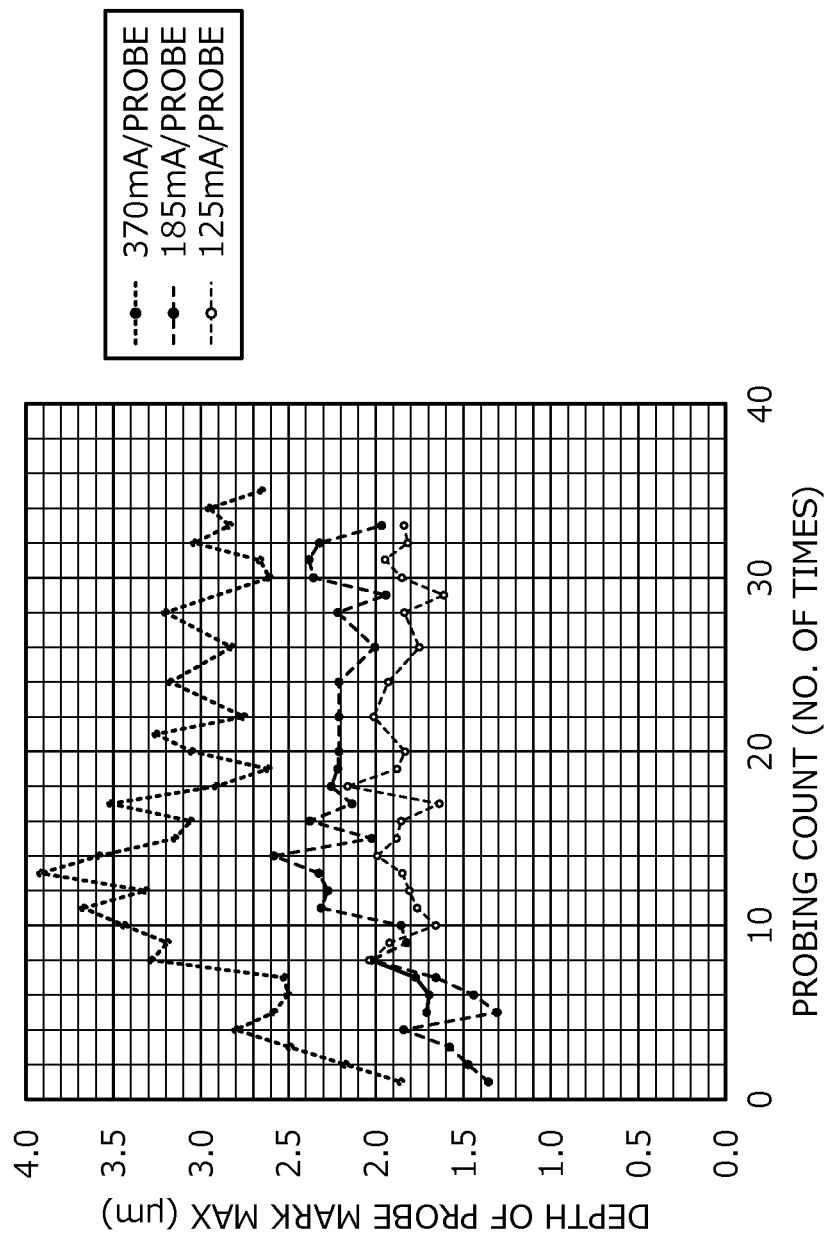

FIG.4

| RATED CURRENT (A) | APPLIED CURRENT (A) | NO. OF PROBES | APPLIED CURRENT DENSITY (A/PROBE) | RATED CURRENT DENSITY (A/PROBE) | DEPTH OF PROBE MARK |
|---|---|---|---|---|---|
| 50 | 20.0 | 56 | 0.3571 | 0.893 | × >2.5μm |
| 47 | 20.0 | 130 | 0.1538 | 0.362 | ○ ≤2.5μm |
| 30 | 20.0 | 100 | 0.2000 | 0.300 | ○ ≤2.5μm |
| 30 | 20.0 | 130 | 0.1538 | 0.231 | ○ ≤2.5μm |
| 75 | 20.0 | 100 | 0.2000 | 0.750 | × >2.5μm |

SILICON CARBIDE SEMICONDUCTOR DEVICE, SEMICONDUCTOR PACKAGE, AND METHOD OF INSPECTING SILICON CARBIDE SEMICONDUCTOR DEVICE

CROSS REFERENCE TO RELATED APPLICATIONS

This application is based upon and claims the benefit of priority of the prior Japanese Patent Application No. 2020-193979, filed on Nov. 24, 2020, the entire contents of which are incorporated herein by reference.

BACKGROUND OF THE INVENTION

1. Field of the Invention

Embodiments of the invention relate to a silicon carbide semiconductor device, a semiconductor package, and a method of inspecting a silicon carbide semiconductor device.

2. Description of the Related Art

A silicon carbide semiconductor device having a MOS gate (insulated gate including a metal, an oxide film, and a semiconductor) structure using silicon carbide (SiC) as a semiconductor material has a problem in that due to energization of a parasitic diode (body diode) formed by a pn junction in a semiconductor substrate (semiconductor chip), stacking faults grow in the semiconductor substrate and ON voltage Von increases. The ON voltage Von is a potential difference between a drain electrode and a source electrode, occurring in a state in which current (drift current) of a predetermined amount flows in a direction from the drain electrode to the source electrode during application of a predetermined gate voltage.

With continued use of a silicon carbide semiconductor device in which stacking faults have grown, the ON voltage Von is assumed to further increase. Therefore, with respect to silicon carbide semiconductor devices in which stacking faults have grown, methods of eliminating such devices as defective products have been attempted by pre-energizing the silicon carbide semiconductor device before shipping and comparing the ON voltage Von of the silicon carbide semiconductor device or forward voltage Vf of a body diode of the silicon carbide semiconductor device before and after energization to thereby screen (identify) silicon carbide semiconductor devices having a large fluctuation of these voltages Von, Vf.

As a method of inspecting a conventional silicon carbide semiconductor device, a method of passing a pulsed current through a body diode of a MOSFET, from an energizing unit of an inspection apparatus and intentionally growing stacking faults has been proposed (for example, refer to Japanese Laid-Open Patent Publication No. 2015-065250). In Japanese Laid-Open Patent Publication No. 2015-065250, pulsed current is passed through the body diode of the MOSFET, whereby a temperature of the body diode during energization is kept low and a growth rate of the stacking faults is increased compared to an instance in which direct current is passed through the body diode of the MOSFET, thereby growing the stacking fault in as short a period of time as possible.

Further, as a conventional silicon carbide semiconductor device, a device has been proposed in which an inspection electrode is disposed on a front surface of a semiconductor substrate, in a region thereof different from an active region, a probe for applying voltage to the semiconductor substrate during inspection being pressed against the inspection electrode disposed separate from a surface electrode of the active region (for example, refer to Japanese Laid-Open Patent Publication No. 2018-120879). In Japanese Laid-Open Patent Publication No. 2018-120879, the inspection electrode disposed in the region different from the active region is short-circuited with the surface electrode of the active region by a metal plating film formed after the inspection, whereby the inspection electrode and the surface electrode of the active region are set as a single electrode.

SUMMARY OF THE INVENTION

According to an embodiment of the invention, a silicon carbide semiconductor device includes a semiconductor substrate containing silicon carbide, having a first main surface and a second main surface opposite to each other; a pn junction provided in the semiconductor substrate; an electrode pad for passing a current through the pn junction in a forward direction or applying a voltage to the pn junction in the forward direction when a voltage has been applied, the electrode pad being provided on the first main surface of the semiconductor substrate; a protective film covering the first main surface of the semiconductor substrate; a wiring region that is a portion of the electrode pad, exposed in an opening of the protective film and in which a wiring member is bonded; and a probe region that is a portion of the electrode pad, different from the wiring region and exposed in the opening of the protective film, a probe being pressed against the probe region during an energization inspection. A probe mark is generated in the probe region by the probe that is pressed against the electrode pad during the energization inspection, and an overlap of the probe mark and the wiring region is at most 30% of a mathematical area of the wiring region.

Objects, features, and advantages of the present invention are specifically set forth in or will become apparent from the following detailed description of the invention when read in conjunction with the accompanying drawings.

BRIEF DESCRIPTION OF THE DRAWINGS

FIG. 1 is a plan view of a layout when a silicon carbide semiconductor device according to an embodiment is viewed from a front side of a semiconductor substrate.

FIG. 2 is a table showing results of verification of a number of probes per unit current based on a rate current for an experiment example_1.

FIG. 3 is a characteristics diagram showing results of verification of a current density per 1 probe based on applied current of an experiment example_2-1.

FIG. 4 is a table showing results of verification of a current density per 1 probe based on a rated current of an experiment example_2-2.

DETAILED DESCRIPTION OF THE INVENTION

Figure 5:
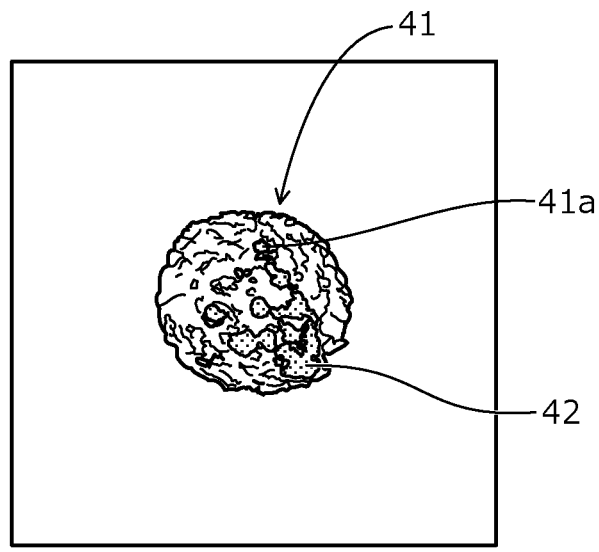
FIG. 5 is a plan view schematically depicting a state of a tip of a probe of an experiment example_3.

First, problems associated with the conventional techniques are discussed. During screening inspection of the silicon carbide semiconductor device, the probe, which is a needle-shaped metal contact, is pressed against the surface electrode to apply voltage to and pass current through the semiconductor substrate from the surface electrode via the probe. In an instance in which the surface electrode to which the probe is pressed is a metal electrode formed using, for example, aluminum (Al) having a lower hardness than the probe, a deep recess (probe mark) occurs in the surface electrode due to the probe. A depth of the probe mark tends to be deeper depending on a magnitude of the current passed through the semiconductor substrate via the probe and a temperature of the semiconductor substrate.

In the method of inspecting the conventional silicon carbide semiconductor device, under a condition that current of about several 10 A is passed through the semiconductor substrate from the surface electrode via the probe like during energization of the body diode, the probe mark may reach a depth about equal to a thickness of the surface electrode. When the depth of the probe mark becomes too deep, a problem arises in that the probe penetrates through the surface electrode, damaging a structure therebelow such as an interlayer insulating film and therefore, the surface electrode and gate electrodes beneath the interlayer insulating film short-circuit, cracking occurs in a barrier metal between the surface electrode and the interlayer insulating film, and fluctuation of gate potential increases.

Embodiments of a silicon carbide semiconductor device, a semiconductor package, and a method of inspecting a silicon carbide semiconductor device according to the present invention will be described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without+ or −. In the description of the embodiments below and the accompanying drawings, main portions that are identical will be given the same reference numerals and will not be repeatedly described.

A structure of a silicon carbide semiconductor device according to an embodiment is described taking a MOSFET (metal oxide semiconductor field effect transistor: MOS-type field effect transistor including an insulated gate having a 3-layer structure including a metal (gate electrode), an oxide film (gate insulating film), and a semiconductor (first, second, and third semiconductor regions)) as an example. FIG. 1 is a plan view of a layout when the silicon carbide semiconductor device according to the embodiment is viewed from a front side of a semiconductor substrate. In FIG. 1, openings 21, 22 of a passivation film (protective film) containing, for example, a polyimide and protecting a front surface of a semiconductor substrate 10 are indicated by thick lines.

A silicon carbide semiconductor device 3 according to the embodiment depicted in FIG. 1 is a vertical MOSFET having, in an active region 1 of the semiconductor substrate (semiconductor chip) 10 containing silicon carbide, multiple unit cells (non-depicted functional units of a device element) of a MOS gate structure, a source pad (electrode pad) 11 connecting source electrodes (first electrodes) of the unit cells to one another in parallel, and a gate pad (electrode pad) 12 common to the unit cells. Each of the unit cells of the MOSFET has an identical general MOS gate structure in the semiconductor substrate 10, at the front side thereof.

The active region 1 is provided in substantially a center (chip center) of the semiconductor substrate 10. The active region 1 is a region through which a main current (drift current: current between a drain and source) of the silicon carbide semiconductor device 3 passes in a direction from a back surface of the semiconductor substrate 10 toward a front surface of the semiconductor substrate 10 (direction opposite to a depth direction Z), when the silicon carbide semiconductor device 3 is ON. The active region 1, for example, has a substantially rectangular shape in a plan view thereof (in FIG. 1, indicated by a finely dashed line) and occupies a majority of a surface area of the semiconductor substrate 10. An edge termination region 2 is between the active region 1 and ends (chip ends) of the semiconductor substrate 10.

The edge termination region 2 is adjacent to the active region 1, surrounds a periphery of the active region 1, and has a function of mitigating electric field of the front surface side of the semiconductor substrate 10 and sustaining a breakdown voltage. In the edge termination region 2, for example, a general voltage withstanding structure (not depicted) such as a field limiting ring (FLR), a junction termination extension (JTE) structure, etc. is disposed. The breakdown voltage is a voltage limit at which no erroneous operation or destruction of the semiconductor device occurs.

In the edge termination region 2, a gate runner (not depicted) formed using a polysilicon (poly-Si) layer is provided on the front surface of the semiconductor substrate 10, via a field insulating film (not depicted). On the gate runner, a gate wiring layer (not depicted) formed using a metal layer is provided in contact with the gate runner. The gate runner and the gate wiring layer surround a periphery of the active region 1 in a substantially rectangular shape along a border between the active region 1 and the edge termination region 2. The gate runner and the gate wiring layer are electrically connected to the gate pad 12.

The source pad 11 and the gate pad 12 are disposed on the front surface of the semiconductor substrate 10, in the active region 1. The source pad 11 covers substantially an entire area of the active region 1. Shapes of the source pad 11 and the gate pad 12 in planar views thereof may be variously changed. For example, in a plan view, the source pad 11 may have a substantially rectangular shape with a portion recessed inward. The gate pad 12 may be disposed in the recessed portion of the source pad 11, separate from the source pad 11 and may have a substantially rectangular shape surrounded on 3 sides by the source pad 11.

The source pad 11 and the gate pad 12 are metal films formed using a metal such as, for example, aluminum (Al), copper (Cu), etc. having a hardness lower than that of a probe of an inspection apparatus (not depicted) used during screening inspection of the silicon carbide semiconductor device 3 or are metal films formed using a metal alloy film containing aluminum, copper, etc. as a main constituent. The source pad 11 and the gate pad 12 may have a same stacked structure or may have mutually different stacked structures. The probe is a needle-shaped metal contact for applying a predetermined voltage to and/or passing a predetermined current through the semiconductor substrate 10 during screening inspection of the silicon carbide semiconductor device 3.

"Hardness" is "indentation hardness" expressed as, for example, a load when probes are pressed against an object to be measured (or the object to be measured is pressed against the probes) until later-described probe marks 31, 32 have a predetermined depth; the lower is the hardness, the more easily indentation occurs and the greater is the physical damage to the source pad 11 and a lower layer structure therebelow (interlayer insulating film, barrier metal, etc.). In particular, for example, the "hardness" is "Vicker's hardness" expressed by a quotient obtained by dividing a predetermined load by a surface area based on a length of a diagonal of a recess generated when a square-based-pyramid diamond is pressed, by the predetermined load, against an object to be measured.

A portion of the source pad 11 is exposed in the opening 21 of the passivation film covering the front surface of the semiconductor substrate 10. The opening 21 of the passivation film may include multiple openings respectively exposing different portions of the source pad 11 (in FIG. 1, two (2) openings 21 are disposed). In each opening 21 of the passivation film, the portion of the source pad 11 exposed therein has a wiring region 21a and a probe region 21b. A package wiring member such as, for example, wiring, a lead frame, etc. for leading out potential of the source pad 11 to an external destination is bonded to the wiring regions 21a of the source pad 11.

The wiring regions 21a and the probe regions 21b of the source pad 11 may be disposed so as to not overlap each other as much as possible and preferably, may be apart from one another. For example, of the portions of the source pad 11 exposed in the openings 21 of passivation film, the probe regions 21b of the source pad 11 may be an entire area or a part of a portion excluding the wiring regions 21a. In this instance, for example, in the opening 21 of the passivation film, after arrangement and a surface area of the wiring regions 21a are determined, a remaining portion suffices to be set as the probe regions 21b.

In an instance in which the surface area of the portions of the source pad 11 exposed in the openings 21 of the passivation film is small and the wiring regions 21a and the probe regions 21b cannot be completely apart from each other, the wiring regions 21a to which wiring of the source pad 11 is connected and the probe regions 21b to which the probes are pressed against, for example, may overlap by at most about 30% of a mathematical area of the wiring regions 21a.

The probes are pressed against the probe regions 21b of the source pad 11 during screening inspection of the silicon carbide semiconductor device 3. In particular, in the probe regions 21b of the source pad 11, multiple probes disposed at predetermined intervals are pressed a predetermined number of times (1 time or 2 times successively at a same location: probing count). In the probe regions 21b of the source pad 11, recesses (probe marks) 31 generated by the probes have a depth corresponding to the hardness of the source pad 11 and are equal in number to the number of pressed probes.

The probe marks 31, for example, in a plan view thereof, have a substantially circular shape with a diameter in a range from more than about 10 μm to not more than 100 μm. In general, to energize a parasitic diode (body diode) formed by a pn junction between a base region (second semiconductor region) and a drift region (first semiconductor region) of the MOSFET, while a relatively large number of probes having a relatively small diameter are used, in the embodiment, the probe regions 21b and the wiring regions 21a of the source pad 11 are provided so as to not overlap as much as possible, whereby the probe marks 31 are not generated (or are few) in the portions of the source pad 11 constituting bonding interfaces with the wiring members and therefore, adverse effects on device element characteristics due to the probe marks 31 may be suppressed.

The depth of the probe marks 31, as described above, tends to be deeper depending on the magnitude of the current passed through the semiconductor substrate 10 via the probes and the temperature of the semiconductor substrate 10 at that time. In general, for example, a needle-shaped tungsten (W) wire having, in a plan view thereof, a circular shape and a surface covered with gold (Au) plating is used for a probe 41 (refer to later-described FIGS. 5 and 7). During screening inspection, when the probe 41 is pressed against an electrode pad 40, a portion (electrode material) of the electrode pad 40 may adhere to a tip 41a of the probe 41.

In this state, when the silicon carbide semiconductor device 3 is energized via the probe 41, the electrode material of the electrode pad 40 becomes welded to the metal plating film covering the surface of the probe 41, whereby a sharp and pointed metal protrusion 42 (refer to later-described FIGS. 5 and 7) is formed at a portion of the tip 41a of the probe 41. When the probe 41 having the tip 41a that is sharp and pointed due to the metal protrusion 42 welded in this manner is pressed against the electrode pad 40, the depth of a probe mark 43 (corresponds to the probe marks 31, 32 in FIG. 1) formed in the electrode pad 40 is assumed to become deeper (refer to later-described FIG. 6).

Thus, preferably, a number of the probe marks 31 may be as few as possible. Portions where the probe marks 31 occur may be any place in the probe regions 21b of the source pad 11 or may be closer to the center of the semiconductor substrate 10 than are the wiring regions 21a. Further, the number of probes may be set so that the number of the probe marks 31 occurring in the probe regions 21b of the source pad 11 per unit current based on a rated current (maximum current value that may be passed) of the silicon carbide semiconductor device 3 is greater than, for example, 2 marks/A (ampere).

In other words, the number of probes per unit current based on the rated current of the silicon carbide semiconductor device 3 suffices to be greater than about 2 probes/A. Under these conditions, as the number of probes pressed against the source pad 11 increases, the current value distributed to each of the probes (current density per 1 probe) decreases, whereby the depth of the probe marks 31 occurring in the source pad 11 is shallower. In particular, the current density per 1 probe may be, for example, at most about 0.2 A/probe based on, for example, current passed through the silicon carbide semiconductor device 3 (drift current of the MOSFET or forward current of the body diode: hereinafter, applied current).

Further, based on the rated current of the silicon carbide semiconductor device 3, the current density per 1 probe may be less than about 0.75 A/probe and preferably, may be less than about 0.5 A/probe. Further, the current density per 1 probe is set to be not more than about 0.2 A/probe based on the applied current of the silicon carbide semiconductor device 3, whereby compared to an instance in which these conditions are not assumed, the depth of the probe marks 31 generated in the source pad 11 are shallow and physical damage to the source pad 11 and a lower layer structure therebelow due to the probes is suppressed.

More specifically, for example, in an instance in which the rated current of the silicon carbide semiconductor device 3 is 47 A, the number of probes used in the screening inspection is more than 130 probes (130 probes/47 A≈2.77 probes/A). In FIG. 1, the semiconductor substrate 10 has widths wx, wy of 7.5 mm and 6.7 mm, respectively, in directions X, Y that are orthogonal to each other and parallel to the front surface of the semiconductor substrate 10 and the semiconductor substrate 10 is depicted in a state in which in each of the two probe regions 21b of the source pad 11, 66 probes (total of 132 probes) are disposed at equal intervals.

A pitch between any adjacent two of the probes, for example, is set so that a density of the probe marks 31 generated in the probe regions 21b of the source pad 11 is greater than 16 marks/cm$^2$ and specifically, may be less than about 0.25 cm and, for example, may be about 150 μm. The probes are pressed under the conditions described above, whereby the depth of the probe marks 31 may be set to be less than 2.5 μm. A thickness of the source pad 11 is, in general, for example, about 5 μm and therefore, when the depth of the probe marks 31 is less than 2.5 μm, penetration therethrough by the probe may be sufficiently prevented.

The probing count of the probes used during the screening inspection may be, for example, about 2 times or less. Forward current energization of the body diode for several minutes to several tens of minutes is necessary. Therefore, as the number of times the probes are pressed (probing count) is increased, productivity decreases and thus, is impractical meanwhile the probe marks become large and/or deep and thus, is not desirable. Therefore, the probing count of the probes used for the screening inspection has the upper limit described above.

In each of the probe regions 21b of the source pad 11, some (for example, 1 or 2 probes) of the probes pressed thereagainst may be used for temperature sensing or current sensing of the silicon carbide semiconductor device 3 (MOSFET). FIG. 1 depicts a state in which in each of the probe regions 21b of the source pad 11, one of the probe marks 31 formed therein is a probe mark 31b (white circle) formed by a sensing probe while all other remaining probe marks are probe marks 31a (black circles) formed by the probes for the screening inspection.

ON resistance of each of the unit cells of the silicon carbide semiconductor device 3 is substantially a same as an overall ON resistance of the silicon carbide semiconductor device 3. The silicon carbide semiconductor device 3 is turned ON when a sensing probe is used and a voltage (forward voltage) that is positive with respect to the source electrodes of some (for example, about 10) of the unit cells (for example, at least about 1000) of the silicon carbide semiconductor device 3 is applied to a drain electrode 112 (back electrode (second electrode) of the semiconductor substrate 10, refer to later-described FIGS. 9 and 10), whereby overcurrent (OC) flowing in the silicon carbide semiconductor device 3 may be detected.

Alternatively, forward current is passed through the body diodes of some (for example, about 10) of the unit cells (for example, at least about 1000) of the silicon carbide semiconductor device 3, using a sensing probe. As a result, the temperature of the silicon carbide semiconductor device 3 may be detected using diode temperature characteristics. A process of applying a predetermined voltage and/or passing a predetermined current using a screening inspection probe and a process of applying a predetermined voltage and/or passing a predetermined current using a sensing probe, for example, are repeatedly performed alternately.

In an instance of a configuration in which the semiconductor substrate 10 having the silicon carbide semiconductor device 3 has the MOSFET that is a main semiconductor device element and a current sensing portion or a temperature sensing portion or both, the screening inspection probes and the sensing probes may be used concurrently and concurrently with the screening inspection, overcurrent detection or temperature detection or both for the silicon carbide semiconductor device 3 may be performed. The current sensing portion is a vertical MOSFET having unit cells configured similarly to those of the main semiconductor device element, the current sensing portion having a fewer number of unit cells than the number of unit cells of the main semiconductor device element.

The current sensing portion has gates and a drain respectively connected in parallel to those of the main semiconductor device element, and has a function of detecting overcurrent by operating under the same conditions as those of the main semiconductor device element and passing a small current proportional to the current flowing in the main semiconductor device element. The temperature sensing portion has a function of detecting the temperature of the main semiconductor device element, using diode temperature characteristics. The temperature sensing portion may be, for example, a polysilicon diode formed by a polysilicon (poly-Si) layer provided on a field oxide film (not depicted) on the front surface of the semiconductor substrate 10, or a diffused diode formed by diffused regions in the semiconductor substrate 10.

A portion of the gate pad 12 is exposed in the opening 22 of the passivation film. The portion of the gate pad 12 exposed in the opening 22 of the passivation film has a wiring region 22a and a probe region 22b. A package wiring member such as, for example, wiring, a lead frame, etc. for applying gate voltage to the gate pad 12 is bonded to the wiring region 22a of the gate pad 12. The wiring region 22a and the probe region 22b are provided in the gate pad 12 for a same reason that the wiring regions 21a and the probe regions 21b are provided in the source pad 11.

The wiring region 22a and the probe region 22b of the gate pad 12, similarly to the source pad 11, may be disposed so as to not overlap each other as much as possible. For example, the probe region 22b of the gate pad 12 may be a part of the portion of the gate pad 12 exposed in the opening 22 of the passivation film excluding the wiring region 22a. In this instance, for example, in the opening 22 of the passivation film, after arrangement and a surface area of the wiring region 22a of the gate pad 12 are determined, a remaining portion suffices to be set as the probe region 22b.

The probes are pressed against the probe region 22b of the gate pad 12 during the screening inspection of the silicon carbide semiconductor device 3. In the probe region 22b of the gate pad 12, probe marks 32 are generated equal in number to the number of pressed probes and have a depth corresponding to the hardness of the gate pad 12. A condition for a number of the probe marks 32 generated in the gate pad 12 (i.e., condition for the number of probes pressed against the probe region 22b of the gate pad 12) is a same condition as that for the probe marks 31 generated in the source pad 11.

Some (for example, half) of the probes pressed against the probe region 22b of the gate pad 12 may be set as a probe for sensing current or sensing the temperature of the silicon carbide semiconductor device 3. FIG. 1 depicts a state in which of the four (4) probe marks 32 formed in the probe region 22b of the gate pad 12, two (2) are probe marks 32a (black circles) formed by two (2) screening inspection probes while the other two (2) are two (2) probe marks 32b (white circles) formed by sensing probes.

Gate electrodes 108 (refer to later-described FIG. 9) of all of the unit cells of the silicon carbide semiconductor device 3 (MOSFET) are electrically connected to the gate pad 12 via the gate runner and the gate wiring layer. During the screening inspection and temperature detection, gate voltage is not applied to the gate pad 12, or gate voltage that is a negative voltage with respect to the source electrodes (the source pad 11) of the MOSFET is applied. During overcurrent detection, gate voltage at least equal to the gate threshold voltage of the silicon carbide semiconductor device 3 is applied to the gate pad 12.

A method of inspecting the silicon carbide semiconductor device 3 according to the embodiment is described taking a screening inspection as an example. The screening inspection is performed with respect to the semiconductor substrate 10 separated into individual chip-shapes (semiconductor chips (MOSFET chips) in which the silicon carbide semiconductor device 3 is fabricated), the screening inspection being performed after completion of the silicon carbide semiconductor device 3 but before shipping of the silicon carbide semiconductor device 3. First, when a transport means places the semiconductor substrate 10 on a conductive stage (not depicted) of an inspection apparatus with the back surface of the semiconductor substrate 10 facing the stage, the drain electrode 112 (refer to later-described FIGS. 9 and 10) of the semiconductor substrate 10 is connected to a measuring apparatus (tester).

Different probes are respectively pressed against the source pad 11 and the gate pad 12 of the semiconductor substrate 10 that has been placed on the stage of the inspection apparatus and via the probes, the source pad 11 and the gate pad 12 are electrically connected to the measuring apparatus. Further, in a state in which gate voltage is not applied to the gate pad 12 or a state in which negative gate voltage is applied to the gate pad 12 via the probes, a predetermined voltage is applied between the source pad 11 and the drain electrode 112 via the probes, whereby the body diode of the MOSFET is energized and the forward voltage Vf is measured.

Alternatively, in a state in which voltage (forward voltage) that is positive with respect to the source pad 11 is applied to the drain electrode 112, gate voltage that is at least equal to the gate threshold voltage of the MOSFET is applied to the gate pad 12 and the ON voltage Von is measured. Either the ON voltage Von of the MOSFET or the forward voltage Vf of the body diode of the MOSFET is compared before and after the voltage application. The semiconductor substrate 10 for which fluctuation of the ON voltage Von is large is screened (identified), whereby the silicon carbide semiconductor device 3 in which a stacking fault has grown may be removed as a defective product.

Conditions for pressing the probes (location where the probes are pressed (the probe regions 21b, 22b), the number of probes, the current density per 1 probe, the pitch between adjacent probes (probe density being greater than 16 probes/cm$^2$), and the probing count) during the screening inspection are set as the conditions described above. As a result, the depth of the probe marks 31, 32 generated in the source pad 11 and the gate pad 12, respectively, are shallow and physical damage to the source pad 11 and the gate pad 12 by the probe may be suppressed.

In overvoltage detection and temperature detection as well, conditions for pressing the probes against the electrode pads (the source pad 11 and the gate pad 12) are set to be the same conditions for the screening inspection described above, whereby the probe marks 31 may be suppressed from becoming deep, similarly as during the screening inspection described above. Further, in an instance in which surfaces of the electrode pads are covered by a nickel (Ni) plating film, while the depth of the probe marks is extremely shallow, in this instance as well, the method of inspecting the silicon carbide semiconductor device 3 according to the embodiment is applied, whereby the probe marks are less likely to occur.

After the screening inspection, the semiconductor substrate 10 (the silicon carbide semiconductor device 3) is mounted on a circuit pattern of a mounting substrate 131 (refer to later-described FIG. 10) by a general assembly process. Further, for example, wiring members such as lead frames, bonding wires containing aluminum are respectively wire bonded (ultrasonic bonding) to the wiring regions 21a of the source pad 11 of the semiconductor substrate 10 and the wiring region 22a of the gate pad 12. Thereafter, the semiconductor substrate 10 is sealed, thereby completing the semiconductor package 130 (refer to later-described FIG. 10).

The stage of the inspection apparatus, the probes, and the transport means, etc. are controlled by a control unit (not depicted). Further, the method of inspecting the silicon carbide semiconductor device according to the present embodiment (the semiconductor substrate 10) may be implemented by executing, on a computer such as a personal computer, a workstation, a database server, a webserver, etc., a program prepared in advance. Inspection results and detection results obtained by executing this program and information obtained in advance to obtain the inspection results and the detection results are stored to a computer-readable recording medium (not depicted).

Further, the program is recorded to a computer-readable recording medium and is executed by being read from the recording medium by a computer or a server. The recording medium is a solid-state drive (SSD), a hard disk drive (HDD), a Blu-ray (registered trademark) disk (BD), a flexible disk, a USB flash memory, a CD-ROM, an MO, a DVD, or the like. Further, the program may be a transmission medium that may be distributed via a network such as the Internet.

As described above, according to the embodiment, the wiring regions in which the package wiring members are bonded and the probe regions to which the probes are pressed against are provided in an electrode pad of the silicon carbide semiconductor device so as to not overlap as much as possible. In an instance in which the wiring regions and the probe regions overlap, the overlap is set to be at most 30% of the mathematical area of the wiring regions. As a result, probe marks are not generated (or are few) in the electrode pad at portions thereof constituting bonding interfaces with the wiring members and therefore, adverse effects on device element characteristics by the probe marks may be suppressed and adverse effects on the reliability of the silicon carbide semiconductor device due to the energization inspection using the probes may be suppressed.

Further, according to the embodiment, when the silicon carbide semiconductor device is subject to the energization inspection using the probes, the number of probes pressed against the electrode pad is set per unit current based on the rate current of the silicon carbide semiconductor device such as, for example, more than 2 probes/A. Under this condition, as the number of probes pressed against the electrode pad is increased, the greater the current value distributed to each probe (the current density per 1 probe) is decreased, whereby the depth of the probe marks occurring in the electrode pad may be reduced. As a result, damage to the electrode pad and a lower layer structure therebelow by the probes may be suppressed.

For the silicon carbide semiconductor device 3 according to the embodiment described above (refer to FIG. 1), the number of probes per unit current ([probes/A]) based on the rated current was verified. FIG. 2 is a table showing results of verification of the number of probes per unit current based on the rate current for an experiment example_1. The screening inspection was performed on vertical MOSFETs (hereinafter, the experiment example_1) each having a structure similar to that of the silicon carbide semiconductor device 3 and for which the rated current and the number of probes pressed against the probe regions 21b of the source pad 11 were variously changed.

Results of measurement of the depth of the probe marks 31 generated in the probe regions 21b of each test specimen of the experiment example_1 are depicted in FIG. 2. All of the test specimens of the experiment example_1 and the source pad 11 each had a thickness of 5 µm; an interval between adjacent probes was 150 µm; and the probing count was one (1) time. In FIG. 2, the total number of probes [probes] is the total number of probes pressed against the source pad 11 and the number of probes pressed in each of the probe regions 21b is a quotient of the "total number of probes" divided by the number of the probe regions 21b formed in the source pad 11 (here, two (2)) (similarly in FIG. 4).

Further, in FIG. 2, the number of probes [probes/A] is the number of probes per unit current based on the rated current and is obtained by dividing the total number of probes by the rated current. The number of probes [probes/A] is the same in each of the probe regions 21b of the source pad 11. In FIG. 2, as indicated by "depth of probe mark", when the depth of the probe marks 31 is at most ½ of the thickness of the source pad 11 (2.5 µm), the corresponding test specimen is regarded to be a non-defective product ("○" mark) and when the depth of the probe marks 31 exceeds ½ of the thickness of the source pad 11 (>2.5 µm), the corresponding test specimen is regarded to be a defective product ("X" mark).

From the results shown in FIG. 2, it was confirmed that when the number of probes per unit current based on the rated current exceeds 2 probes/A, physical damage to the source pad 11 by the probes is mitigated and the depth of the probe marks 31 is at most ½ of the thickness of the source pad 11. On the other hand, when the number of probes per unit current based on the rated current is 2 probes/A or less, it was confirmed that physical damage to the source pad 11 by the probes increases and the depth of the probe marks 31 exceeds ½ of the thickness of the source pad 11.

For the silicon carbide semiconductor device 3 according to the embodiment described above (refer to FIG. 1), the current density per 1 probe [A/probe] was verified. FIG. 3 is a characteristics diagram showing results of verification of the current density per 1 probe based on applied current of an experiment example_2-1. FIG. 4 is a table showing results of verification of the current density per 1 probe based on the rated current of an experiment example_2-2. The screening inspection was performed on vertical MOSFETs (hereinafter, the experiment examples 2-1, 2-2) each having a structure similar to that of the silicon carbide semiconductor device 3 and for which the current density per 1 probe was variously changed, the results are shown in FIGS. 3 and 4.

FIG. 3 depicts the results of variously changing the current density per 1 probe based on the applied current of the experiment example_2-1, and verifying, by different device elements, the depth of the probe marks each time a probe is pressed against a same location in the probe regions 21b of the source pad 11. In the experiment example_2-1, the forward current (applied current) of the body diode of the vertical MOSFETs was set as 20 A and the number of probes pressed against the probe regions 21b of the source pad 11 was variously changed to vary the current density per 1 probe based on the applied current of each test specimen.

FIG. 4 depicts results of variously changing the current density per 1 probe based on the rated current of the experiment example_2-2, and verifying the depth of the probe marks when the probes are pressed against the probe regions 21b of the source pad 11 one (1) time. In the experiment example_2-2, the rated current of the vertical MOSFETs and the number of probes pressed against the probe regions 21b of the source pad 11 were variously changed to vary the current density per 1 probe based on the rated current of each test specimen and the current density per 1 probe based on the applied current.

All of the test specimens of the experiment examples 2-1, 2-2 and the source pad 11 each has a thickness of 5 µm; an interval between adjacent probes was 150 µm; and the screening inspection was performed with the semiconductor substrate 10 heated to 175 degrees C. In the experiment example_2-2, as indicated by "depth of probe mark" in FIG. 4, when the depth of the probe marks 31 is at most ½ of the thickness of the source pad 11 (2.5 µm), the corresponding test specimen is regarded to be a non-defective product ("○" mark) and when the depth of the probe marks 31 exceeds ½ of the thickness of the source pad 11 (>2.5 µm), the test specimen is regarded to be a defective product ("X" mark).

From the results shown in FIG. 3, it was confirmed that the greater is the current density per 1 probe based on the applied current, the deeper is the depth of the probe marks 31. The inventors confirmed that when the current density per 1 probe based on the applied current is at most 0.2 A/probe, the depth of the probe marks 31 tend to be shallower. Further, from the results shown in FIG. 4, it was confirmed that when the current density per 1 probe based on the rated current is less than 0.75 A/probe, the depth of the probe marks 31 may be reduced.

Further, from the results shown in FIG. 4, it was confirmed that by setting the current density per 1 probe based on the rated current to be less than 0.75 A/probe, the physical damage to the source pad 11 by the probes decreases and the depth of the probe marks 31 are at most ½ of the thickness of the source pad 11. On the other hand, it was confirmed that when the current density per 1 probe based on the rated current is at least 0.75 A/probe, the physical damage to the source pad 11 by the probes increases and the depth of the probe marks 31 exceeds ½ of the thickness of the source pad 11.

Figure 6:
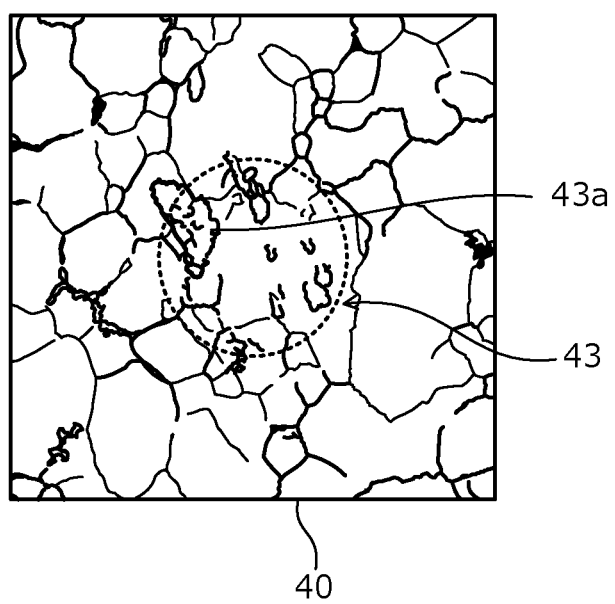
FIG. 6 is a plan view schematically depicting a state of a probe mark due to the probe in FIG. 5.
Figure 7:
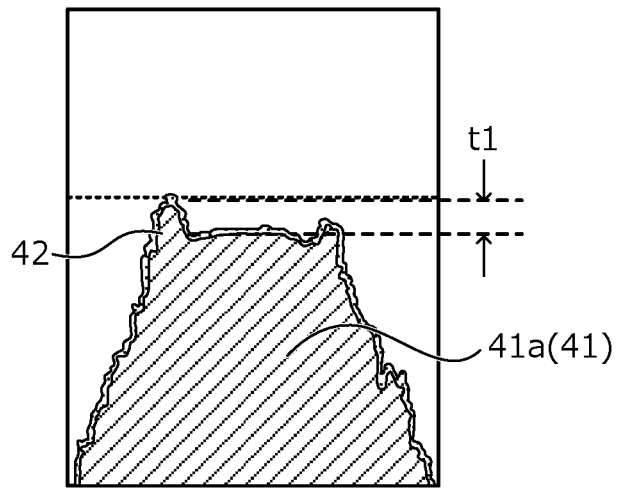
FIG. 7 is a cross-sectional view schematically depicting a shape of the tip of the probe in FIG. 5.
Figure 8:
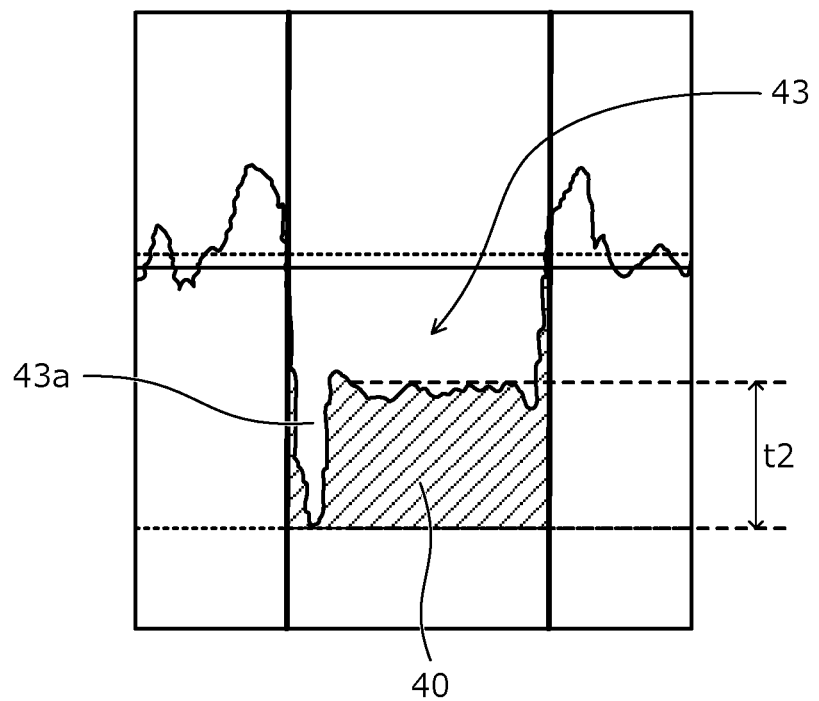
FIG. 8 is a cross-sectional view schematically depicting a shape of the probe mark in FIG. 6.

A relationship between the shape of the tip of a probe and the shape of a probe mark (recess) was verified. FIG. 5 is a plan view schematically depicting a state of the tip of a probe of an experiment example_3. FIG. 6 is a plan view schematically depicting a state of a probe mark due to the probe in FIG. 5. FIG. 7 is a cross-sectional view schematically depicting the shape of the tip of the probe in FIG. 5. FIG. 8 is a cross-sectional view schematically depicting the shape of the probe mark in FIG. 6. FIGS. 6 and 8 depict the probe mark 43 formed in the electrode pad 40 (aluminum film) after the probe 41 in FIGS. 5 and 7 has been pressed against the electrode pad 40 thirty-five (35) times (probing count).

From the results shown in FIGS. 5 and 7, it was confirmed that a portion of the electrode pad 40 is welded due to the pressing of the probe 41, and a sharply pointed and protruding metal protrusion (aluminum piece) 42 is formed at a portion of the tip 41a of the probe 41. In this manner, it was confirmed that when the probe 41 on which the metal protrusion 42 is formed is again pressed against the same electrode pad 40, or when the probe 41 is pressed against a subsequent object under inspection (the electrode pad 40 (the semiconductor substrate 10)), the probe mark 43 generated in the electrode pad 40 has a part (hereinafter, deep part) 43a that is relatively deeper (refer to FIGS. 6 and 8).

The deep part 43a of the probe mark 43 of the electrode pad 40 was confirmed to have a depth t2 substantially equivalent to a thickness t1 of the metal protrusion 42 of the tip 41a of the probe 41 and a cross-sectional shape that is substantially similar to that of the metal protrusion 42 (refer to FIGS. 7 and 8). Therefore, it is assumed that the metal protrusion 42 is formed on the tip 41a of the probe 41, whereby the probe mark 43 of the electrode pad 40 becomes deeper. In FIG. 5, the metal protrusion 42 is indicated by dotted hatching. In FIG. 6, an approximate outline of the probe mark 43 is indicated by a dashed line. In FIGS. 7 and 8, the probe 41 and the electrode pad 40 are indicated by oblique lines of hatching.

Figure 9:
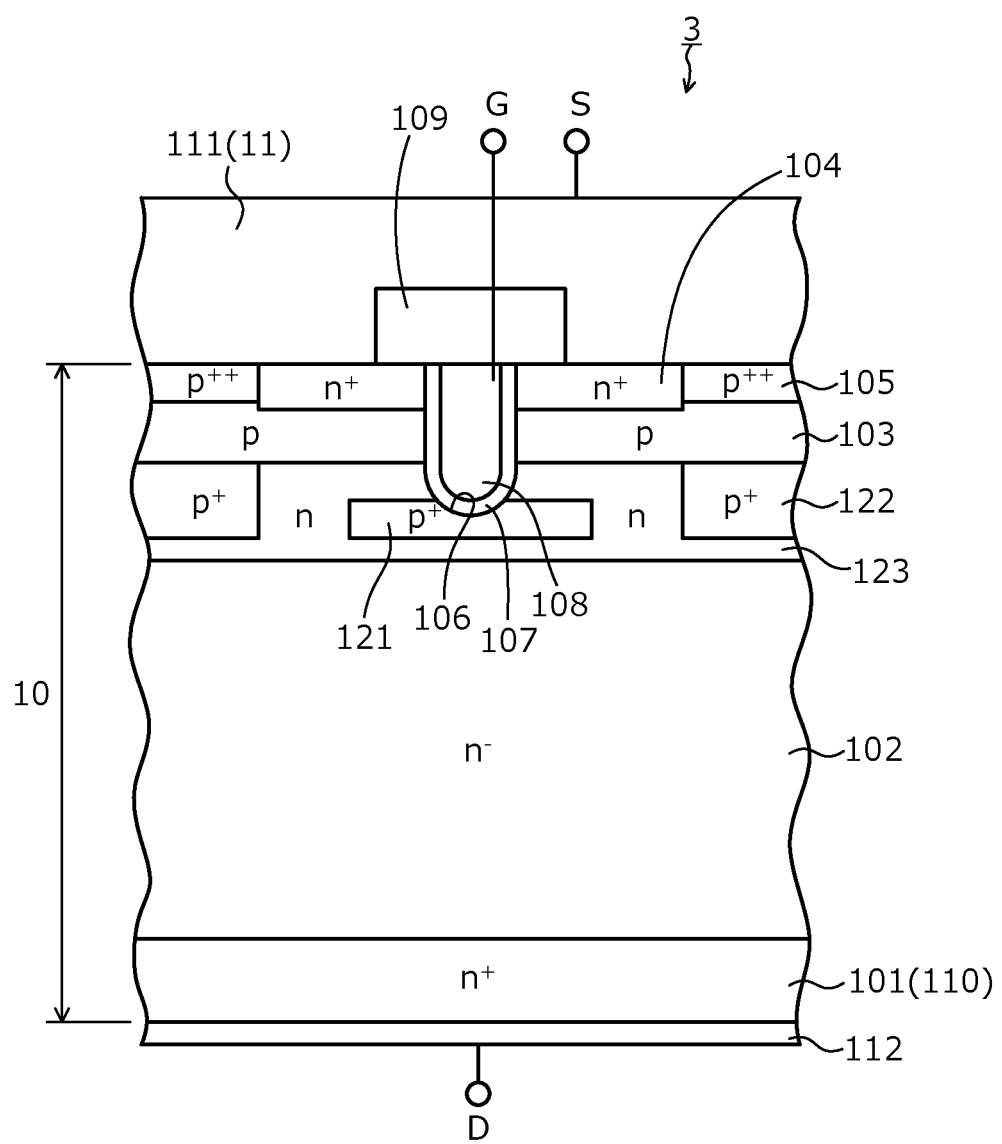
FIG. 9 is a cross-sectional view depicting a structure of the silicon carbide semiconductor device according to the embodiment.

An example of a cross-section of the structure of the silicon carbide semiconductor device 3 according to the embodiment described above (refer to FIG. 1) is shown in FIG. 9. FIG. 9 is a cross-sectional view depicting the structure of the silicon carbide semiconductor device 3 according to the embodiment. The silicon carbide semiconductor device 3 according to the embodiment depicted in FIG. 9 is a vertical SiC-MOSFET having a trench gate structure on the front side of the semiconductor substrate 10 that contains silicon carbide (SiC) as a semiconductor material. The semiconductor substrate 10 is an epitaxial substrate in which epitaxial layers constituting an n--type drift region 102 (first semiconductor region) and a p-type base region 103 (second semiconductor region) are stacked on a front surface of an n+-type starting substrate 110 that contains SiC as a semiconductor material.

The semiconductor substrate 10 has a main surface regarded as a front surface (first main surface) having the p-type base region 103 and a main surface regarded as a back surface (back surface of the n+-type starting substrate 110) having the n+-type starting substrate 110. The n+-type starting substrate 110 is an n+-type drain region 101. The trench gate structure is configured by the p-type base region 103, n+-type source regions (third semiconductor region) 104, p++-type contact regions 105, trenches 106, gate insulating films 107, and gate electrodes 108. Between the p-type base region 103 and the n--type drift region 102, an n-type current spreading region 123 and p+-type regions 121, 122 may be selectively provided at deep positions closer to the n+-type drain region 101 than are bottoms of the trenches 106.

The n-type current spreading region 123 is a so-called current spreading layer (CSL) that reduces carrier spreading resistance. The n-type current spreading region 123 has an upper surface (surface facing the n+-type source regions 104) in contact with the p-type base region 103 and a lower surface (surface facing the n+-type drain region 101) in contact with the n--type drift region 102. The p+-type regions 121, 122 have a function of mitigating electric field applied to the gate insulating films 107 at the bottoms of the trenches 106. The p+-type regions 121 are provided separate from the p-type base region 103 and face the bottoms of the trenches 106 in the depth direction. The p+-type regions 121 may reach the bottoms of the trenches 106.

The p+-type regions 121, for example, are partially connected to the p+-type regions 122 at non-depicted portions and are thereby electrically connected to a source electrode 111. Each of the p+-type regions 122 is provided between an adjacent two of the trenches 106, separate from the p+-type regions 121 and the trenches 106. The p+-type regions 122 have an upper surface in contact with the p-type base region 103. The p+-type regions 121, 122 have a lower surface that may be in contact with the n--type drift region 102. In an instance in which the n-type current spreading region 123 is omitted, the n--type drift region 102 extends from the n+-type drain region 101 to the p-type base region 103 and between the p+-type regions 121, 122 adjacent to one another.

The n+-type source regions 104 and the p++-type contact regions 105 are selectively provided between the front surface of the semiconductor substrate 10 and the p-type base region 103. The n+-type source regions 104, the p++-type contact regions 105, the n-type current spreading region 123, and the p+-type regions 121, 122 are diffused regions formed by ion implantation in the epitaxial layer. The trenches 106 penetrate through the n+-type source regions 104 and the p-type base region 103 from the front surface of the semiconductor substrate 10 and reach the n-type current spreading region 123. In the trenches 106, the gate electrodes 108 are provided via the gate insulating films 10. The gate electrodes 108 are electrically connected to the gate pad 12 (refer to FIG. 1).

In FIG. 9, while only one unit cell (constituent unit of a device element) of the MOSFET is depicted, multiple unit cells of the same trench gate structure are connected in parallel in the semiconductor substrate 10. An interlayer insulating film 109 is provided on the front surface of the semiconductor substrate 10 and covers the gate electrodes 108. The interlayer insulating film 109 has contact holes in which the n+-type source regions 104 and the p++-type contact regions 105 are exposed. In the contact holes of the interlayer insulating film 109, the source electrode (first electrode) 111 is in ohmic contact with the front surface of the semiconductor substrate 10, and is electrically connected to the n+-type source regions 104, the p++-type contact regions 105, and the p-type base region 103. The source electrode 111 also serves as the source pad 11.

The drain electrode 112 is provided in an entire area of the back surface of the semiconductor substrate 10. The drain electrode 112 also serves as a drain pad (electrode pad). For example, in an instance of the silicon carbide semiconductor device 3 being mounted in a later-described semiconductor package 130, a predetermined gate voltage G is applied to the gate electrodes 108, from an external source via the gate pad 12. A source potential S of the source electrode 111 is pulled out to an external destination by a wiring member such as a later-described bonding wire 133. A drain potential D of the drain electrode 112 is pulled out to an external destination by a conductive layer 131b of a later-described mounting substrate 131 and an external connection terminal (not depicted). The silicon carbide semiconductor device 3 may have a planar gate structure instead of the trench gate structure.

Figure 10:
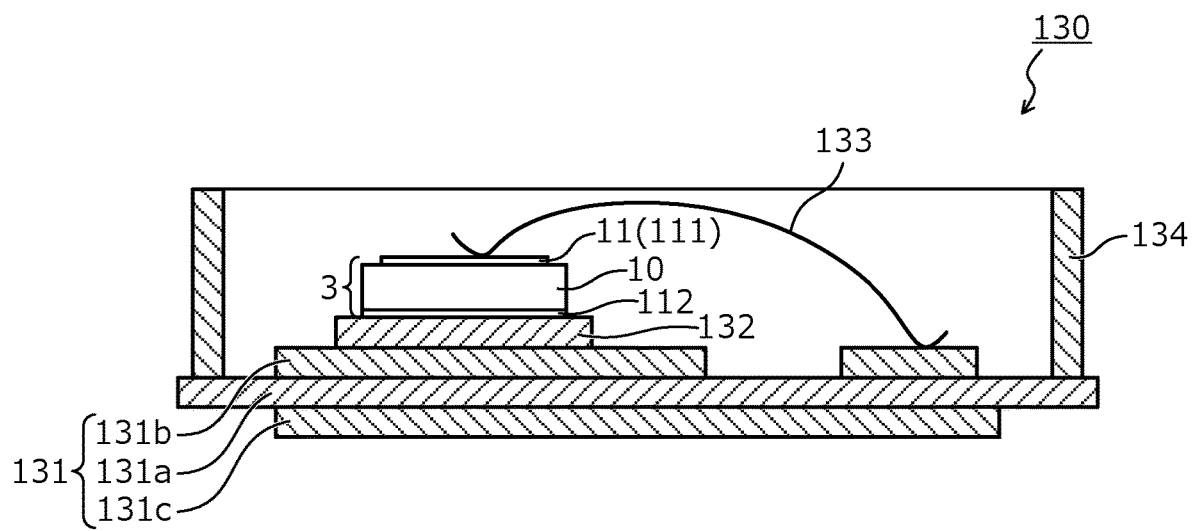
FIG. 10 is a cross-sectional view schematically depicting a structure of a semiconductor package according to the embodiment.

An example of a semiconductor package in which the silicon carbide semiconductor device 3 according to the embodiment described above (refer to FIG. 1) is mounted is depicted in FIG. 10. FIG. 10 is a cross-sectional view schematically depicting a structure of a semiconductor package according to the embodiment. The semiconductor package 130 according to the embodiment depicted in FIG. 10 is a semiconductor circuit device in which a surface electrode (the drain electrode 112) on the back surface of the semiconductor substrate (semiconductor chip) 10 on which the silicon carbide semiconductor device 3 described above (refer to FIGS. 1 and 9) is fabricated is bonded on the conductive layer 131b of the mounting substrate 131 by solder 132. In the mounting substrate 131, the conductive layer 131b that forms a predetermined circuit pattern is formed on a first surface of an insulated substrate 131a and a conductive layer 131c is formed on a second surface of insulated substrate 131a.

The surface electrode (the drain electrode 112) provided on a main surface (the back surface) of the semiconductor substrate 10 facing the mounting substrate 131 is bonded to the conductive layer 131b via the solder 132, whereby the semiconductor substrate 10 is mounted to the mounting substrate 131. The drain electrode 112 of the semiconductor substrate 10 is electrically connected to the conductive layer 131b via the solder 132. The surface electrode (the source pad 11) provided on a main surface (front surface) of the semiconductor substrate 10, opposite to the main surface thereof facing the mounting substrate 131, for example, is electrically connected to the conductive layer 131b and/or another device element, etc. via the bonding wire (wiring member) 133. Instead of the bonding wire 133, a pin (cylindrical rod) containing a conductive material or a flat, plate-like wiring member may be used.

The conductive layer 131c of the mounting substrate 131 is joined to a cooler (not depicted) via a heat transfer paste. Heat generated by the electrode pad of the semiconductor substrate 10 and the conductive layer 131b is transferred from the conductive layer 131c to the cooler and is dissipated, whereby the semiconductor substrate 10 is cooled. A case 134 is bonded to a periphery of the mounting substrate 131, thereby housing the semiconductor substrate 10 (the silicon carbide semiconductor device 3) in the case 134. The case 134 surrounds the surface of the mounting substrate 131 on which the semiconductor substrate 10 is mounted. The case 134 is filled with a sealing material such as a gel or an epoxy resin, thereby increasing a withstand voltage of the semiconductor package 130. In the case 134, a control board (not depicted) having a circuit for protecting and controlling the silicon carbide semiconductor device 3, etc. may be further provided.

In the foregoing, the present invention is not limited to the embodiments described above and various modifications within a range not departing from the spirit of the invention are possible. For example, in the embodiments described above, while a vertical MOSFET is described as an example, without limitation hereto, the present invention is applicable to a silicon carbide semiconductor device including various structures having an electrode pad. In the embodiments described above, while the screening inspection of a vertical MOSFET is described as an example, without limitation hereto, the present invention is applicable to various types of energization inspections in which a probe is pressed against an electrode pad of a silicon carbide semiconductor device.

According to the silicon carbide semiconductor device, the semiconductor package, and the method of inspecting a silicon carbide semiconductor device of the present invention, the wiring regions in which package wiring members are bonded and the probe regions to which probes are pressed against are disposed in the electrode pad, whereby no probe marks are generated in the electrode pad, at portions thereof constituting bonding interfaces with the wiring members. As a result, adverse effects on device element characteristics by the probe marks may be suppressed and therefore, by the energization inspection using the probes (inspection performed by applying voltage and passing current, via the probes), an effect may be achieved in that adverse effects on the reliability of the silicon carbide semiconductor device may be suppressed.

As described above, the silicon carbide semiconductor device, the semiconductor package, and the method of inspecting a silicon carbide semiconductor device according to the invention are useful for vertical MOSFETs used in power converting equipment, power source devices of various industrial machines, etc. and are particularly suitable for vertical MOSFETs having an electrode pad formed using a metal (for example, aluminum, copper, or an alloy containing at least one of these) having a hardness lower than that of the probes.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A silicon carbide semiconductor device, comprising:
   a semiconductor substrate containing silicon carbide, having a first main surface and a second main surface opposite to each other;
   a pn junction provided in the semiconductor substrate;
   an electrode pad for passing a current through the pn junction in a forward direction or applying a voltage to the pn junction in the forward direction when a voltage has been applied, the electrode pad being provided on the first main surface of the semiconductor substrate;
   a protective film covering the first main surface of the semiconductor substrate and having an opening;
   a wiring region that is a portion of the electrode pad exposed from the opening of the protective film, and in which a wiring member is to be bonded; and
   a probe region that is a portion of the electrode pad, is different from the wiring region and is exposed in the opening of the protective film, the probe region having a probe mark of a probe for an energization inspection, wherein
   an area of the probe mark that overlaps the wiring region is at most 30% of an entire area of the wiring region in a plan view of the silicon carbide semiconductor device.

2. The silicon carbide semiconductor device according to claim 1, wherein
   the probe mark is provided only within the probe region.

3. The silicon carbide semiconductor device according to claim 1, wherein
   the probe mark has a circular shape with a diameter that is greater than 10 μm but not more than 100 μm in the plan view.

4. The silicon carbide semiconductor device according to claim 1, wherein
   the probe mark is provided in plurality, and a quantity of the probe mark per unit current based on a rated current is greater than 2 marks/A.

5. The silicon carbide semiconductor device according to claim 1, wherein
   the probe mark is provided in plurality, and a density of the probe mark is greater than 16 marks/cm$^2$.

6. The silicon carbide semiconductor device according to claim 1, wherein
   the electrode pad is made of an aluminum film or an aluminum alloy film.

7. The silicon carbide semiconductor device according to claim 1, further comprising:

a first semiconductor region of a first conductivity type, provided in the semiconductor substrate;

a second semiconductor region of a second conductivity type, provided between the first main surface of the semiconductor substrate and the first semiconductor region, the second semiconductor region forming the pn junction with the first semiconductor region;

a third semiconductor region of the first conductivity type, selectively provided between the first main surface of the semiconductor substrate and the second semiconductor region;

a gate insulating film provided in contact with a region of the second semiconductor region, the region being between the third semiconductor region and the first semiconductor region;

a gate electrode provided facing the second semiconductor region with the gate insulating film intervening therebetween;

a first electrode electrically connected to the second semiconductor region and the third semiconductor region, and electrically connected to the electrode pad; and a second electrode provided on the second main surface of the semiconductor substrate.

8. A semiconductor package, comprising:

a silicon carbide semiconductor device including:

a semiconductor substrate containing silicon carbide, having a main surface, a pn junction provided in the semiconductor substrate, an electrode pad for passing a current through the pn junction in a forward direction or applying a voltage to the pn junction in the forward direction when a voltage has been applied, the electrode pad being provided on the main surface of the semiconductor substrate, a protective film covering the main surface of the semiconductor substrate and having an opening, a wiring region that is a portion of the electrode pad exposed from the opening of the protective film, and a probe region that is a portion of the electrode pad, is different from the wiring region and is exposed in the opening of the protective film, the probe region having a probe mark of a probe for an energization inspection, an area of the probe mark that overlaps the wiring region is at most 30% of an entire area of the wiring region in a plan view of the silicon carbide semiconductor device;

a mounting substrate on which the semiconductor substrate is mounted; and a wiring member for leading out a potential of the electrode pad to an external destination, the wiring member containing aluminum and being bonded to the wiring region of the electrode pad.

9. A method of inspecting a silicon carbide semiconductor device including a semiconductor substrate containing silicon carbide, a pn junction provided in the semiconductor substrate, an electrode pad provided on a surface of the semiconductor substrate, and a protective film covering the surface of the semiconductor substrate and having an opening that exposes a portion of the electrode pad as an exposed portion, the method comprising:

performing an energization inspection by pressing a probe only within a probe region that is a part of the exposed portion of the electrode pad and is different from a wiring region of the exposed portion to which a wiring member is to be bonded, applying a voltage to the electrode pad via the probe, and applying a voltage to the pn junction in a forward direction or passing a current through the pn junction in the forward direction, wherein performing an energization inspection includes pressing a plurality of probes within the probe region, and a quantity of the probe per unit current based on a rated current is greater than 2 probes/A.

10. The method according to claim 9, wherein a current density per 1 unit of the probe is at most 0.2A/probe based on a current flowing in the semiconductor substrate.

11. The method according to claim 9, wherein a current density per 1 unit of the probe is less than 0.75A/probe based on a rated current.

12. The method according to claim 9, further comprising bonding the wiring member to the wiring region included in the exposed portion for leading out a potential of the electrode pad to an external destination.

* * * * *